(12) United States Patent
Pöchmüller

(10) Patent No.: US 6,472,892 B2
(45) Date of Patent: Oct. 29, 2002

(54) CONFIGURATION FOR TESTING CHIPS USING A PRINTED CIRCUIT BOARD

(75) Inventor: Peter Pöchmüller, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/745,567

(22) Filed: Dec. 21, 2000

(65) Prior Publication Data

US 2001/0005141 A1 Jun. 28, 2001

(30) Foreign Application Priority Data

Dec. 21, 1999 (DE) .......................................... 199 61 791

(51) Int. Cl.[7] .............................................. G01R 31/02
(52) U.S. Cl. ..................... 324/755; 324/754; 324/158.1
(58) Field of Search .............................. 29/847; 324/758, 324/754, 158.1, 755, 763, 762, 761

(56) References Cited

U.S. PATENT DOCUMENTS

| | | | | |
|---|---|---|---|---|
| 5,751,262 A | * | 5/1998 | Browning et al. | ........... 324/754 |
| 5,806,181 A | * | 9/1998 | Khandros et al. | ............. 28/874 |
| 5,900,738 A | * | 5/1999 | Khandros et al. | ........... 324/761 |
| 6,064,217 A | * | 5/2000 | Smith | ........................ 324/760 |
| 6,288,561 B1 | * | 9/2001 | Leedy | ......................... 324/760 |
| 6,336,269 B1 | * | 1/2002 | Eldridge et al. | ............... 29/885 |

OTHER PUBLICATIONS

Published International Application No. 97/30358 (Antonello et al.), dated Aug. 21, 1997.
Published International Application No. 99/15908 (Arima et al.), dated Apr. 1, 1999.

* cited by examiner

Primary Examiner—Michael Sherry
Assistant Examiner—Jimmy Nguyen
(74) Attorney, Agent, or Firm—Laurence A. Greenberg; Werner H. Stemer; Ralph E. Locher

(57) ABSTRACT

A configuration for testing chips includes a printed circuit board having conductive probe needles to electrically connect the printed circuit board to chips and for testing the chips on the printed circuit board in parallel, some of the probe needles configured as dummy needles for mechanically self-aligning the chips. The board is configured closely to the application such that many chips (1) can be tested simultaneously in parallel. The chips can have markings or depressions to be engaged with free ends of the dummy needles remote from the board. Adapters can be disposed between the probe needles and the chips. Also, the chips can have structures disposed thereon between the probe needles and the chips. The board can have alignment aids for orienting the chips.

6 Claims, 1 Drawing Sheet

CONFIGURATION FOR TESTING CHIPS USING A PRINTED CIRCUIT BOARD

BACKGROUND OF THE INVENTION

Field of the Invention

The present invention relates to a configuration for testing chips, i.e., integrated circuits realized in the chips, using a printed circuit board ("PCB"), in which an electrical connection is produced between the PCB and the chip by probe needles.

Chip testing is preferably performed at the wafer level because a multiplicity of chips can be processed in parallel at that level. As such, considerable time and cost is saved. Particularly highly parallel contact-making methods that are based on small dimensioned needles and that take account of a form factor, for example, have recently been regarded as promising. Such tests can, in principle, be carried out by two different methods.

In a first method, a number of highly accurate probe needles are provided on each chip. The probe needles are brought into contact with pads or contact pads on a PCB.

In a second method, the probe needles are fitted in large numbers on a probe card that is used for the parallel testing of a plurality of chips.

The first and second methods are illustrated in FIGS. 2 and 3, respectively.

In FIG. 2, chips 1, 2 are each provided with probe needles 3 that are brought into contact with pads 4 on a PCB 5.

In contrast, the second method uses a probe card 6 equipped with a multiplicity of such probe needles 3 that are brought into contact with a multiplicity of chips 1 on a silicon semiconductor wafer 7.

The first method allows parallel testing of the individual chips 1, 2 on the PCB 5. In the first method, care has to be taken to ensure that the probe needles 3 respectively meet and make reliable contact with their assigned pads 4. A disadvantage of the first method is that accurate centering of the individual probe needles on the pads is difficult, and that the probe needles have to be fixedly connected to the individual chips. Such fixation renders further processing more difficult because the probe needles cannot be removed practically. As a result, the needles have to be taken into account during further use of the chips. In addition, realizing a complete set of probe needles for each chip constitutes a considerable expenditure.

The second method using a probe card 6 does not have the disadvantage of a high outlay for probe needles for each chip. The probe card, with its probe needles, can successively make contact with different sets of chips or the pads thereof. However, the probe card method does have a disadvantage that making contact with the chips of an entire semiconductor wafer is practically ruled out because, according to the current prior art, it is not possible to realize probe cards having tens of thousands of individual probe needles. Such a configuration is necessary because a semiconductor wafer can have up to 1000 chips, with approximately 60 probe needles required for each of these chips. Accordingly, 60,000 probe needles, in total, are necessary for a probe card that tests a wafer or the chips in the wafer. Moreover, it self-evident that working with such a large number of probe needles requires extremely high accuracy in the lateral and perpendicular directions, i.e., in the plane of the semiconductor wafer and in the direction perpendicular to the plane.

SUMMARY OF THE INVENTION

It is accordingly an object of the invention to provide a configuration for testing chips using a printed circuit board that overcomes the hereinafore-mentioned disadvantages of the heretofore-known devices of this general type and that allows parallel testing of a large number of chips with self-alignment.

The object is achieved according to the invention by virtue of the fact that the probe needles are fitted directly on the PCB, which is configured closely to the application, such that a plurality of chips can be tested in parallel on the PCB.

With the foregoing and other objects in view, there is provided, in accordance with the invention, a configuration for testing chips, including a printed circuit board having conductive probe needles to electrically connect the printed circuit board to chips and for testing the chips on the printed circuit board in parallel, some of the probe needles configured as dummy needles for mechanically self-aligning the chips.

The invention makes a fundamental departure from the previous prior art, in that the probe needles are no longer provided on the chip, as in the first method described above, and are, likewise, no longer provided on the probe card, as in the second method described above. Rather, the probe needles are fitted directly on the PCB, resulting in the elimination of the requirements for a probe card to have the largest possible number of probe needles or for probe needles to be on the individual semiconductor chips. The PCB itself should be realized as closely as possible to the application and, for example, simulate the later use of memory chips on a Dual Inline Memory Module ("DIMM").

Fitting the probe needles directly on the PCB makes it possible to make contact with and test a large number of individual chips in parallel. A DIMM-like PCB is advantageously used for testing memory chips because such a PCB allows the memory chip to be tested under application conditions.

It is particularly advantageous if dummy needles are additionally fitted on the PCB for mechanical self-alignment of the chips. These dummy needles can then engage in markings with their free ends remote from the PCB, which markings may be depressions provided on an adapter or "interposer" connected to the chip. Such an interposer may be made of plastic or plastic and metal and is fixedly connected to the actual chip.

In accordance with another feature of the invention, the chips have markings and the dummy needles have free ends remote from the printed circuit board to engage the markings.

In accordance with a further feature of the invention, the markings are depressions.

In accordance with an added feature of the invention, there are provided adapters disposed between the probe needles and the chips.

In accordance with an additional feature of the invention, the chips each have a surface and structures disposed on the surface between the probe needles and respective chips.

In accordance with a concomitant feature of the invention, the printed circuit board has alignment aids for orienting the chips.

An essential advantage of the invention can be seen in the fact that, in contrast to the prior art according to the first method above, the probe needles are no longer connected to the individual chips. Thus, a significantly smaller amount of needles are necessary overall because the needles fitted on the PCB can be readily used for testing succeeding chips. In contrast to the second method described above, such high demands on accuracy, as in the case of probe cards, do not have to be imposed for the configuration according to the invention because self-centering can be achieved by the dummy needles. These dummy needles ensure correct alignment of the probe needles on the pads of the chip or interposer.

The configuration according to the invention also allows testing under similar conditions to those in an actual application of the chips. As a result, it is possible to dispense with safety margins during tests because defective chips can be reliably screened out.

Finally, a further advantage of the configuration according to the invention is that (in contrast to the first method described above) it is possible to dispense with complicated and precise fitting of holders or sockets on the PCB that are often necessary instead of pads.

Other features that are considered as characteristic for the invention are set forth in the appended claims.

Although the invention is illustrated and described herein as embodied in a configuration for testing chips using a printed circuit board, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
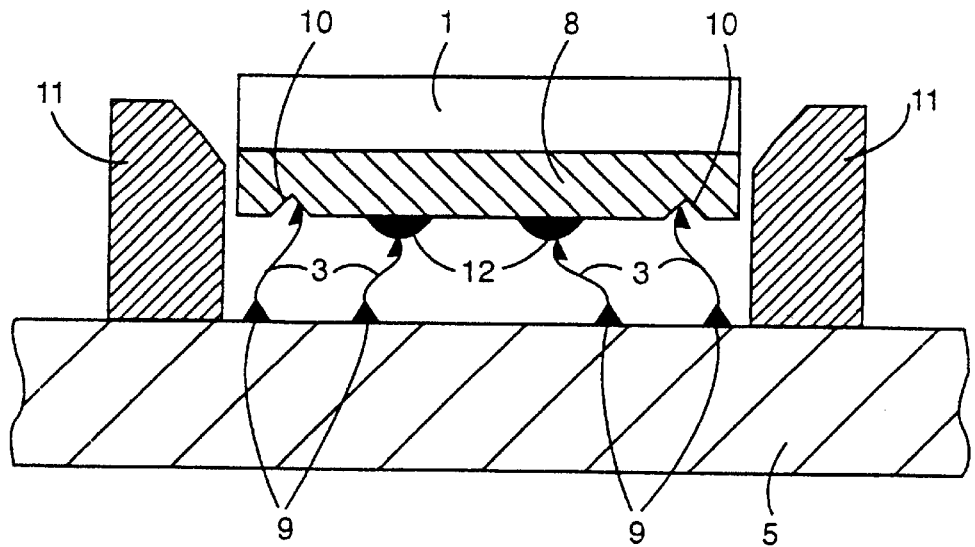
FIG. 1 is a diagrammatic sectional view of the configuration according to the invention.
Figure 2:
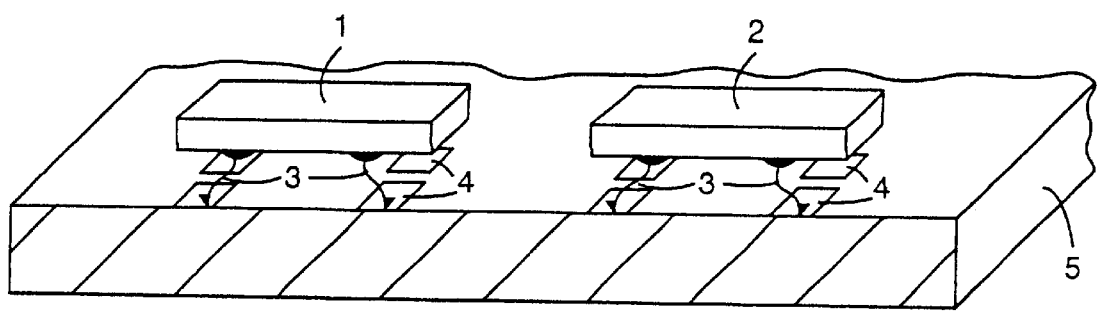
FIG. 2 is a perspective, sectional and fragmentary view of a prior art configuration with probe needles fitted to individual chips.
Figure 3:
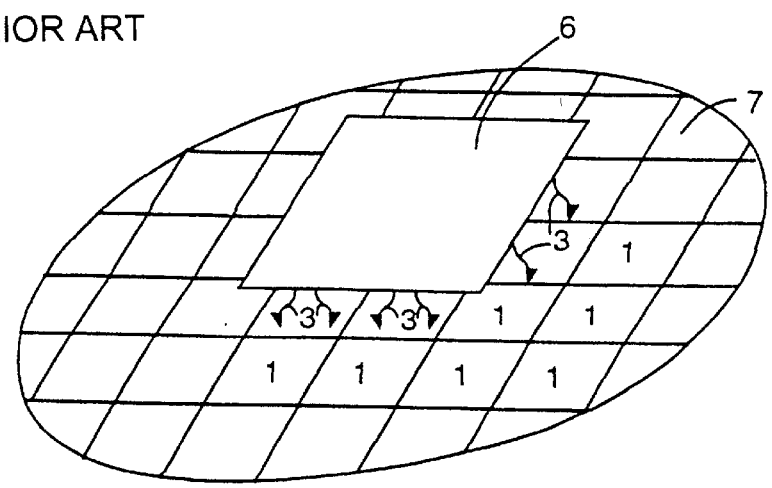
FIG. 3 is a perspective view of another prior art configuration with probe needles fitted to a probe card.

In all the figures of the drawing, sub-features and integral parts that correspond to one another bear the same reference symbol in each case.

Referring now to the figures of the drawings in detail and first, particularly to FIG. 1 thereof, there is shown a chip 1 with an interposer 8, which conventionally is composed of plastic in which metal tracks extend. However, the interposer 8 can also be omitted, if appropriate. Centering is then effected such that corresponding centering structures are etched into the topmost chip layers made, for example, of polyimide and/or silicon dioxide.

FIG. 1 also shows a PCB 5, which is made of epoxy resin, for example, and on which extend conventional conductor tracks. Probe needles 3 are fitted to fixing locations 9 on the non-illustrated conductor tracks or on the surface of the PCB 5. In FIG. 1, the two probe needles, which are in the outer positions and engage in depressions 10 in the interposer 8, act as dummy needles that are not electrically connected. In other words, for example, they are fitted directly on the surface of the PCB.

Centering aids 11 that are fixedly connected to the PCB 5 allow the insertion of the chip 1 with the interposer 8 so that the dummy needles 3 (outer needle positions in FIG. 1) slide into the depressions 10 and align the chip 1 with the interposer 8 exactly above the probe needles 3 disposed in the inner needle positions in FIG. 1. These inner probe needles 3 make contact with corresponding contact pads 12 on the interposer 8. Corresponding non-illustrated conductor tracks lead from these contact pads 12 through the interposer 8 to the chip 1, so that the functions of the chip 1 can be tested as soon as the probe needles 3 touch the contact pads 12. The touching produces an electrical connection to a non-illustrated tester.

Instead of the depressions 10, it is also possible, if appropriate, to provide other markings such as, for example, structures etched into the upper chip layers, the structured being made of polyimide and/or silicon dioxide. Such a configuration may be advantageous if the interposer 8 is eliminated and contact is made directly between the probe needles 3 and the underside of the chip 1.

Configurations of the kind shown in FIG. 1 can be provided in large numbers next to one another on the PCB 5, thereby enabling a multiplicity of chips to be tested simultaneously in parallel on the PCB 5. One tester may suffice for the parallel testing if the tester can evaluate the results of the chips, lying parallel to one another, in an appropriate manner.

I claim:

1. A configuration for testing chips, comprising:
a printed circuit board having conductive probe needles to electrically connect said printed circuit board to chips and for testing the chips on said printed circuit board in parallel, some of said probe needles configured as dummy needles for mechanically self-aligning the chips.

2. The configuration according to claim 1, wherein the chips have markings and said dummy needles have free ends remote from said printed circuit board to engage the markings.

3. The configuration according to claim 2, wherein the markings are depressions.

4. The configuration according to claim 1, including adapters disposed between said probe needles and the chips.

5. The configuration according to claim 1, wherein the chips each have a surface and structures disposed on the surface between said probe needles and respective chips.

6. The configuration according to claim 1, wherein said printed circuit board has alignment aids for orienting the chips.

* * * * *